US012812873B2

(12) United States Patent
Huang et al.

(10) Patent No.: US 12,812,873 B2
(45) Date of Patent: Nov. 24, 2026

(54) SEMICONDUCTOR STRUCTURE

(71) Applicant: United Microelectronics Corp., Hsinchu (TW)

(72) Inventors: Cheng-Tung Huang, Kaohsiung City (TW); Yanjou Chen, Yunlin County (TW); Chien-Yu Ko, Tainan City (TW)

(73) Assignee: United Microelectronics Corp., Hsinchu (TW)

( * ) Notice: Subject to any disclaimer, the term of this patent is extended or adjusted under 35 U.S.C. 154(b) by 662 days.

(21) Appl. No.: 18/352,269

(22) Filed: Jul. 14, 2023

(65) Prior Publication Data

US 2024/0422988 A1 Dec. 19, 2024

(30) Foreign Application Priority Data

Jun. 16, 2023 (CN) ......................... 202310722664.8

(51) Int. Cl.
*H10B 61/00* (2023.01)

(52) U.S. Cl.
CPC .................................... *H10B 61/22* (2023.02)

(58) Field of Classification Search
CPC ........ H10B 61/22; H10B 61/00; H10N 50/01; H10N 50/10
See application file for complete search history.

(56) References Cited

U.S. PATENT DOCUMENTS

| | | | | |
|---|---|---|---|---|
| 11,238,912 | B1 * | 2/2022 | Wu | G11C 11/1655 |
| 2012/0032287 | A1 * | 2/2012 | Li | H10N 50/10 257/E27.103 |
| 2017/0092693 | A1 * | 3/2017 | Tan | H10N 50/01 |
| 2018/0033476 | A1 * | 2/2018 | Oka | G11C 13/0069 |

* cited by examiner

*Primary Examiner* — Shih Tsun A Chou
(74) *Attorney, Agent, or Firm* — JCIPRNET

(57) ABSTRACT

Provided is a semiconductor structure including a circuit layer, an island-shaped conductive layer, a MRAM cell, a bit line and a conductive via. The circuit layer is disposed on a substrate. The island-shaped conductive layer is disposed on the circuit layer. The MRAM cell is disposed between the island-shaped conductive layer and the circuit layer, and is electrically connected to the island-shaped conductive layer and the circuit layer. The bit line is disposed on the island-shaped conductive layer. The conductive via is disposed between the bit line and the island-shaped conductive layer. The island-shaped conductive layer is in contact with a top surface of the MRAM cell.

16 Claims, 3 Drawing Sheets

SEMICONDUCTOR STRUCTURE

CROSS-REFERENCE TO RELATED APPLICATION

This application claims the priority benefit of China application serial no. 202310722664.8, filed on Jun. 16, 2023. The entirety of the above-mentioned patent application is hereby incorporated by reference herein and made a part of this specification.

BACKGROUND

Technical Field

The present invention relates to a semiconductor structure, in particular to a semiconductor structure including a magnetoresistance random access memory (MRAM) cell and a bit line.

Description of Related Art

The non-volatile memory has become a kind of memory widely used in personal computers and other electronic apparatuses due to the advantage that the stored data may not disappear after power failure. The MRAM is a non-volatile memory that stores data according to the direction of the magnetic moment in the magnetic layer.

A MRAM cell usually includes a top electrode, a bottom electrode and a magnetic tunnel junction (MTJ) structure disposed between the top electrode and the bottom electrode. Through the bit line electrically connected to the top electrode, the MRAM cell can be operated. However, as the size of the memory device continues to shrink, the area of the top electrode of the MRAM cell and the width of the bit line also shrink accordingly. As a result, the difficulty of the connection between the bit line and the top electrode of the MRAM cell increases. For example, there is likely to be a gap between the bit line and the top electrode of the MRAM cell, which may cause the bit line to be unable to be effectively electrically connected with the MRAM cell, affecting the performance of the memory device.

SUMMARY

The present invention provides a semiconductor structure, in which an island-shaped conductive layer with a larger area is disposed on the top surface of a MRAM cell to facilitate the electrical connection between the bit line and the MRAM cell.

The semiconductor structure of the present invention includes a circuit layer, an island-shaped conductive layer, a MRAM cell, a bit line and a conductive via. The circuit layer is disposed on a substrate. The island-shaped conductive layer is disposed on the circuit layer. The MRAM cell is disposed between the island-shaped conductive layer and the circuit layer, and is electrically connected to the island-shaped conductive layer and the circuit layer. The bit line is disposed on the island-shaped conductive layer. The conductive via is disposed between the bit line and the island-shaped conductive layer. The island-shaped conductive layer is in contact with a top surface of the MRAM cell.

In an embodiment of the semiconductor structure of the present invention, a projection area of the island-shaped conductive layer on the substrate is larger than a projection area of the MRAM cell on the substrate.

In an embodiment of the semiconductor structure of the present invention, one island-shaped conductive layer is connected to the top surface of one MRAM cell.

In an embodiment of the semiconductor structure of the present invention, the island-shaped conductive layer includes a metal layer.

In an embodiment of the semiconductor structure of the present invention, a semiconductor device is disposed on a surface of the substrate, and the circuit layer is electrically connected to the semiconductor device.

In an embodiment of the semiconductor structure of the present invention, the semiconductor device includes a transistor.

In an embodiment of the semiconductor structure of the present invention, the MRAM cell includes a top electrode, a bottom electrode and a MTJ structure disposed between the top electrode and the bottom electrode.

The semiconductor structure of the present invention includes a substrate, a circuit layer, a first conductive layer, a MRAM cell, a first conductive via, a second conductive layer, a second conductive via and a third conductive via. The substrate has a memory region and a peripheral region. The circuit layer is disposed on the substrate, and includes a memory circuit portion located in the memory region and a peripheral circuit portion located in the peripheral region that are separated from each other. The first conductive layer is disposed on the circuit layer, and includes an island portion located in the memory region and a first circuit portion located in the peripheral region that are separated from each other. The MRAM cell is disposed between the island portion and the memory circuit portion, and electrically connected to the island portion and the memory circuit portion. The first conductive via is disposed between said first circuit portion and the peripheral circuit portion. The second conductive layer is disposed on the first conductive layer, and includes a bit line portion located in the memory region and a second circuit portion located in the peripheral region that are separated from each other. The second conductive via is disposed between the bit line portion and the island portion. The third conductive via is disposed between the first circuit portion and the second circuit portion. The island portion is in contact with a top surface of the MRAM cell.

In an embodiment of the semiconductor structure of the present invention, a projection area of the island portion on the substrate is larger than a projection area of the MRAM cell on the substrate.

In an embodiment of the semiconductor structure of the present invention, one island portion is connected to the top surface of one MRAM cell.

In an embodiment of the semiconductor structure of the present invention, the island portion and the first circuit portion are located at the same level.

In an embodiment of the semiconductor structure of the present invention, a top surface of the island portion is coplanar with a top surface of the first circuit portion.

In an embodiment of the semiconductor structure of the present invention, the bit line portion and the second circuit portion are located at the same level.

In an embodiment of the semiconductor structure of the present invention, a top surface of the bit line portion is coplanar with a top surface of the second circuit portion.

In an embodiment of the semiconductor structure of the present invention, a height of the second conductive via is the same as a height of the third conductive via.

In an embodiment of the semiconductor structure of the present invention, a semiconductor device is disposed on a surface of the substrate, and the circuit layer is electrically connected to the semiconductor device.

In an embodiment of the semiconductor structure of the present invention, the semiconductor device includes a transistor.

In an embodiment of the semiconductor structure of the present invention, the MRAM cell includes a top electrode, a bottom electrode and a MTJ structure disposed between the top electrode and the bottom electrode.

Based on the above, in the semiconductor structure of the present invention, the island-shaped conductive layer (the island portion of the conductive layer) is disposed on the top surface of the MRAM cell, and the projection area of the island-shaped conductive layer (the island portion of the conductive layer) on the substrate is larger than the projection area of the connected MRAM cell on the substrate, so that the island-shaped conductive layer (the island portion of the conductive layer) has a larger area than the top surface of the MRAM cell. Therefore, the conductive via located between the bit line and the MRAM cell may be easily and surely disposed on the island-shaped conductive layer (the island portion of the conductive layer). In this way, the problem that the bit line cannot be effectively electrically connected with the MRRAM cell due to the too small width of the bit line may be avoided.

DESCRIPTION OF THE EMBODIMENTS

Figure 1A:
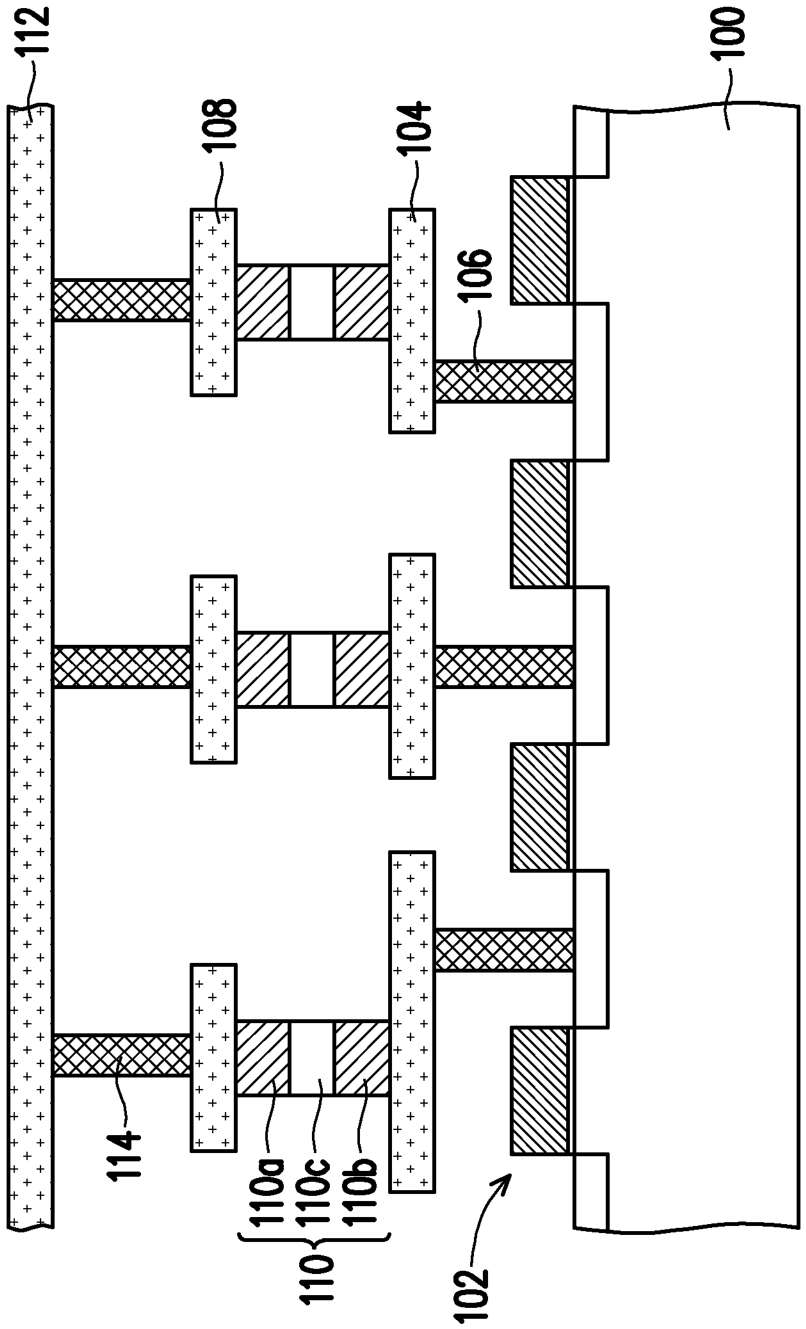
FIG. 1A is a schematic cross-sectional view of the semiconductor structure of the first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In addition, the directional terms, such as "on", "above", "under" and "below" mentioned in the text are only used to refer to the direction of the drawings, and are not used to limit the present invention.

Figure 1B:
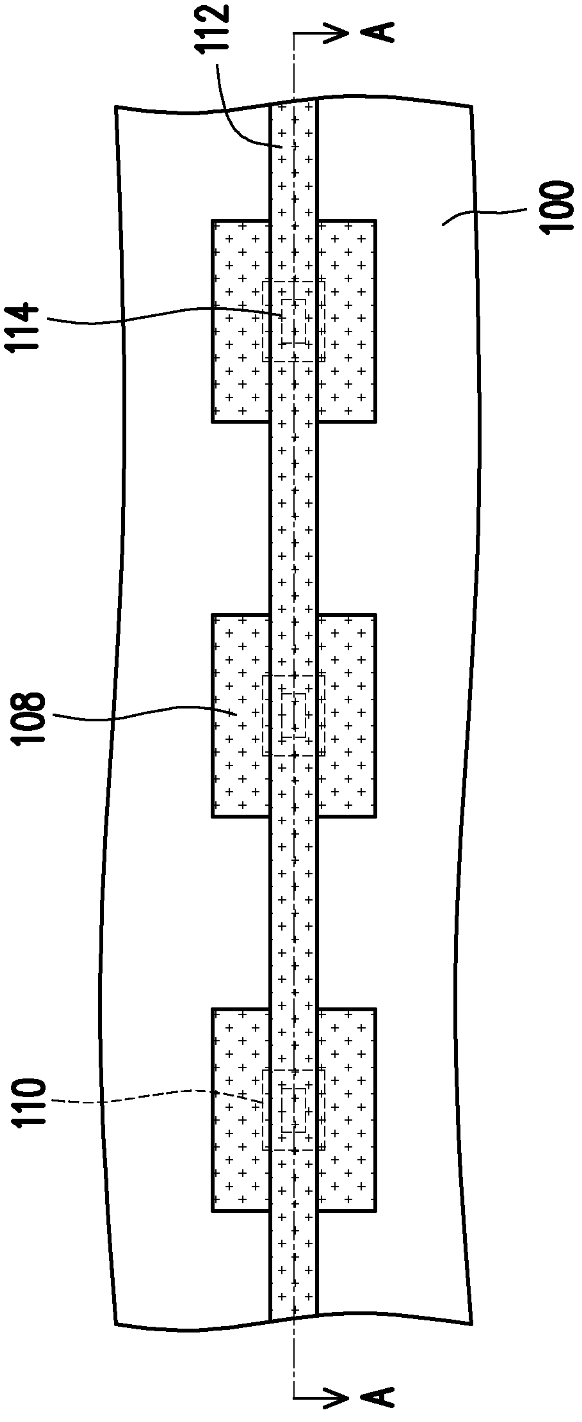
FIG. 1B is a schematic top view of the semiconductor structure of the first embodiment of the present invention.

FIG. 1A is a schematic cross-sectional view of the semiconductor structure of the first embodiment of the present invention, FIG. 1B is a schematic top view of the semiconductor structure of the first embodiment of the present invention, and FIG. 1A is drawn according to the section line A-A in FIG. 1B. In addition, in FIG. 1B, to make the figure clear, the semiconductor device and the interconnect structure disposed on the substrate in FIG. 1A are omitted.

Referring to FIGS. 1A and 1B, the semiconductor structure of the present embodiment may include a substrate 100, a circuit layer 104, conductive vias 106, island-shaped conductive layers 108, MRAM cells 110, a bit line 112 and conductive vias 114. The semiconductor structure of the present embodiment includes a plurality of MRAM cells 110, but the present invention is not limited thereto. In addition, through the bit line 112, the MRAM cells 110 may be operated. Therefore, the semiconductor structure of the present embodiment may be applied to a MRAM apparatus.

In the present embodiment, the substrate 100 may be a silicon substrate, and semiconductor devices 102 may be disposed thereon. The semiconductor device 102 is, for example, a transistor. The circuit layer 104 is disposed on substrate 100. In the present embodiment, the circuit layer 104 is electrically connected to the semiconductor devices 102 disposed on the substrate 100 through the conductive vias 106. Therefore, the circuit layer 104 may be regarded as the first layer of metal layer (metal 1, M1) well known in the art, but the present invention is not limited thereto. In other embodiments, depending on actual needs, more than one circuit layer and conductive vias connecting adjacent circuit layers may be disposed between the circuit layer 104 and the semiconductor devices 102. The circuit layer 104, the conductive vias 106 and the other circuit layers and conductive vias disposed according to the actual needs constitute a well-known interconnect structure.

The island-shaped conductive layer 108 is disposed on the circuit layer 104. In addition, the MRAM cell 110 is disposed between the island-shaped conductive layer 108 and the circuit layer 104, and is electrically connected to the island-shaped conductive layer 108 and the circuit layer 104. The island-shaped conductive layer 108 may be a metal layer. Therefore, in the case that the circuit layer 104 is the first layer of metal layer (M1), the island-shaped conductive layer 108 may be regarded as the second layer of metal layer (M2). In the present embodiment, the MRAM cell 110 may include a top electrode 110*a*, a bottom electrode 110*b* and a MTJ structure 110*c* disposed between the top electrode 110*a* and the bottom electrode 110*b*. The top electrode 110*a* of the MRAM cell 110 is connected to the island-shaped conductive layer 108. That is, in the present embodiment, the island-shaped conductive layer 108 is in contact with the top surface of the MRAM cell 110.

In the present embodiment, an island-shaped conductive layer 108 is only connected to the top surface of one MRAM cell 110. The projection area of the island-shaped conductive layer 108 on the substrate 100 is larger than the projection area of the connected MRAM cell 110 on the substrate 100. That is, in the present embodiment, the island-shaped conductive layer 108 is served as a connection component between the MRAM cell 110 and the other device, such as a conductive via. In addition, since the island-shaped conductive layer 108 has a larger area than the top surface of the MRAM cell 110, the difficulty of connecting the MRAM cell 110 with the other device may be effectively reduced to ensure an effective electrical connection between the two.

In addition, in the present embodiment, the bottom electrode 110*b* of the MRAM cell 110 is in contact with the circuit layer 104, but the present invention is not limited thereto. In other embodiments, the bottom electrode 110*b* may be electrically connected to the circuit layer 104 through a conductive via.

The bit line 112 is disposed on the island-shaped conductive layers 108, and the conductive vias 114 are disposed between the bit line 112 and each of the island-shaped conductive layers 108, so that the bit line 112 may be electrically connected to each MRAM cell 110 through the conductive vias 114 to operate the MRAM cells 110. In the case that the circuit layer 104 is the first layer of metal layer (M1) and the island-shaped conductive layers 108 are the second layer of metal layer (M2), the bit line 112 may be regarded as the third layer of metal layer (M3). In other embodiments, depending on actual needs, more than one circuit layer and conductive vias connecting adjacent circuit layers may be disposed between the bit line 112 and the island-shaped conductive layers 108.

In the present embodiment, since the projection area of the island-shaped conductive layer 108 on the substrate 100 is larger than the projection area of the connected MRAM cell 110 on the substrate 100, the island-shaped conductive layer 108 has a larger area than the top surface of the MRAM cell 110, so each conductive via 114 may be easily and surely disposed on the corresponding island-shaped conductive layer 108. In this way, the bit line 112 may be electrically connected to each MRAM cell 110 through the conductive vias 114, and the problem that the bit line cannot be effectively electrically connected with the MRRAM cell due to the too small width of the bit line may be avoided.

In addition, the semiconductor structure of the present embodiment may be integrated with other structures in the peripheral region, which will be explained below.

Figure 2:
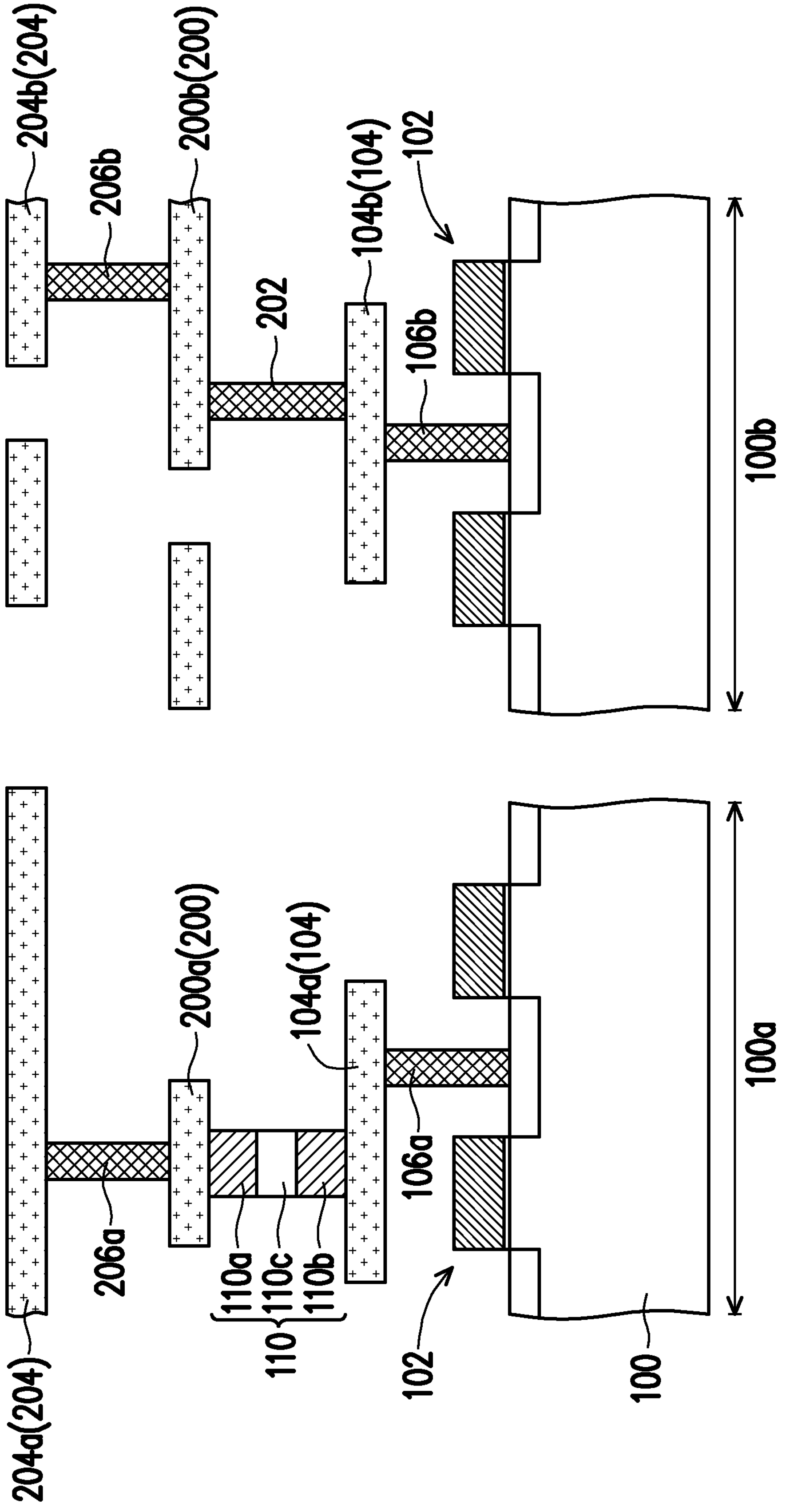
FIG. 2 is a schematic cross-sectional view of the semiconductor structure of the second embodiment of the present invention.

FIG. 2 is a schematic cross-sectional view of the semiconductor structure of the second embodiment of the present invention. In the present embodiment, the same device as that of the first embodiment will be denoted by the same reference numerals and will not be described again.

Referring to FIG. 2, the semiconductor structure of the present embodiment may include the substrate 100, the circuit layer 104, a conductive via **106*a*, a conductive via 106*b*, a first conductive layer 200, a MRAM cell 110, a conductive via 202, a second conductive layer 204, a conductive via 206*a* and a conductive via 206*b*. In the present embodiment, the substrate 100 has a memory region 100*a* and a peripheral region 100*b*. The peripheral region 100*b* is, for example, a logic device region, but the present invention is not limited thereto. The semiconductor devices 102 are disposed on the substrate 100 in the memory region 100*a* and the peripheral region 100*b*. In FIG. 2**, the numbers of various devices are exemplary only, and are not used to limit the present invention.

The circuit layer 104 is disposed on substrate 100. In the present embodiment, the circuit layer 104 includes a memory circuit portion **104*a* located in the memory region 100*a* and a peripheral circuit portion 104*b* located in the peripheral region 100*b* which are separated from each other. The memory circuit portion 104*a* is electrically connected to the semiconductor devices 102 in the memory region 100*a* through the conductive via 106*a*, and the peripheral circuit portion 104*b* is electrically connected to the semiconductor devices 102 in the peripheral region 100*b* through the conductive via 106*b***.

The first conductive layer 200 is disposed on the circuit layer 104. In the present embodiment, the first conductive layer 200 includes an island portion **200*a* located in the memory region 100*a* and a first circuit portion 200*b* located in the peripheral region 100*b* that are separated from each other. The MRAM cell 110 is disposed between the island portion 200*a* and the memory circuit portion 104*a* and is electrically connected to the island portion 200*a* and the memory circuit portion 104*a*. In addition, the conductive via 202 is disposed between first circuit portion 200*b* and peripheral circuit portion 104*b* of the circuit layer 104, so that the first circuit portion 200*b* may be electrically connected to the semiconductor devices 102 in the peripheral region 100*b* through the conductive via 202, the peripheral circuit portion 104*b* and the conductive via 106*b***.

The island portion **200*a* of the first conductive layer 200 may be corresponded to the island-shaped conductive layer 108 in the first embodiment. As the island-shaped conductive layer 108, the island portion 200*a* is in contact with the top surface of the MRAM cell 110. In addition, one island portion 200*a* is only connected to the top surface of one MRAM cell 110. The projection area of the island portion 200*a* on the substrate 100 is larger than the projection area of the connected MRAM cell 110 on the substrate 100. Since the island portion 200*a* has a larger area than the top surface of the MRAM cell 110, the difficulty of connecting the MRAM cell 110** with the other device, such as the conductive via, may be effectively reduced to ensure an effective electrical connection between the two.

In the present embodiment, the first conductive layer 200 includes the island portion **200*a* and the first circuit portion 200*b* which are separated from each other, and the island portion 200*a* and the first circuit portion 200*b* are located at the same level. In addition, the top surface of the island portion 200*a* may be coplanar with the top surface of the first circuit portion 200*b***.

In addition, in the present embodiment, the bottom electrode **110*b* of the MRAM cell 110 is in contact with the memory circuit portion 104*a* of the circuit layer 104, but the present invention is not limited thereto. In other embodiments, the bottom electrode 110*b* may be electrically connected to the memory circuit portion 104*a* of the circuit layer 104** through a conductive via.

The second conductive layer 204 is disposed on the first conductive layer 200, and includes a bit line portion **204*a* located in the memory region 100*a* and a second circuit portion 204*b* located in the peripheral region 100*b* that are separated from each other. In the case that the circuit layer 104 is the first layer of metal layer (M1) and the first conductive layer 200 is the second layer of metal layer (M2), the second conductive layer 204 may be regarded as the third layer of metal layer (M3). In other embodiments, depending on actual needs, more than one circuit layer and conductive vias connecting adjacent circuit layers may be disposed between the second conductive layer 204 and the first conductive layer 200**.

The bit line portion **204*a* is disposed on the island portion 200*a*, and the conductive via 206*a* is disposed between the bit line portion 204*a* and the island portion 200*a*, so that the bit line portion 204*a* may be electrically connected to the MRAM cell 110 through the conductive via 206*a* to operate the MRAM cells 110**.

The second circuit portion **204*b* is disposed on the first circuit portion 200*b*, and the conductive via 206*b* is disposed between the first circuit portion 200*b* and the second circuit portion 204*b*, so that the second circuit portion 204*b* may be electrically connected to the semiconductor devices 102 in the peripheral region 100*b* through the conductive via 206*b*, the first circuit portion 200*b*, the conductive via 202, the peripheral circuit portion 104*b* and the conductive via 106*b***.

In the present embodiment, the second conductive layer 204 includes the bit line portion **204*a* and the second circuit portion 204*b* which are separated from each other, and the bit line portion 204*a* and the second circuit portion 204*b* are located at the same level. In addition, the top surface of the bit line portion 204***a* may be coplanar with the top surface of the second circuit portion 204*b*. In addition, in the present embodiment, since the top surface of the island portion 200*a* may be coplanar with the top surface of the first circuit portion 200*b*, the conductive via 206*a* and the conductive via 206*b* may have the same height.

In the present embodiment, since the projection area of island portion 200*a* on substrate 100 is larger than the projection area of the connected MRAM cell 110 on substrate 100, the island portion 200*a* has a larger area than the top surface of the MRAM cell 110, so the conductive via 206*a* may be easily and surely disposed on the corresponding island portion 200*a*. In this way, the bit line portion 204*a* used as a bit line may be electrically connected to the MRAM cell 110 through the conductive via 206*a*, and the problem that the bit line cannot be effectively electrically connected with the MRRAM cell due to the too small width of the bit line may be avoided.

The semiconductor structures of the first embodiment and second embodiment may be applied to various types of MRAM apparatuses. For example, the semiconductor structure of the embodiment of the present invention may be applied to a MRAM apparatus including 3 transistors and 2 MRAM cells (3T2M), but the present invention is not limited thereto.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure, comprising:

a circuit layer, disposed on a substrate;

an island-shaped conductive layer, disposed on the circuit layer;

a magnetoresistance random access memory (MRAM) cell, disposed between the island-shaped conductive layer and the circuit layer, and electrically connected to the island-shaped conductive layer and the circuit layer;

a bit line, disposed on the island-shaped conductive layer; and a conductive via, disposed between the bit line and the island-shaped conductive layer, wherein the island-shaped conductive layer is in contact with a top surface of the MRAM cell, wherein a projection area of the island-shaped conductive layer on the substrate is larger than a projection area of the MRAM cell on the substrate.

2. The semiconductor structure of claim 1, wherein the island-shaped conductive layer is connected to the top surface of the MRAM cell.

3. The semiconductor structure of claim 1, wherein the island-shaped conductive layer comprises a metal layer.

4. The semiconductor structure of claim 1, wherein a semiconductor device is disposed on a surface of the substrate, and the circuit layer is electrically connected to the semiconductor device.

5. The semiconductor structure of claim 4, wherein the semiconductor device comprises a transistor.

6. The semiconductor structure of claim 1, wherein the MRAM cell comprises a top electrode, a bottom electrode and a magnetic tunnel junction (MTJ) structure disposed between the top electrode and the bottom electrode.

7. A semiconductor structure, comprising:

a substrate, having a memory region and a peripheral region;

a circuit layer, disposed on the substrate, and comprising a memory circuit portion located in the memory region and a peripheral circuit portion located in the peripheral region that are separated from each other;

a first conductive layer, disposed on the circuit layer, and comprising an island portion located in the memory region and a first circuit portion located in the peripheral region that are separated from each other;

a MRAM cell, disposed between the island portion and the memory circuit portion, and electrically connected to the island portion and the memory circuit portion;

a first conductive via, disposed between said first circuit portion and the peripheral circuit portion;

a second conductive layer, disposed on the first conductive layer, and comprising a bit line portion located in the memory region and a second circuit portion located in the peripheral region that are separated from each other;

a second conductive via, disposed between the bit line portion and the island portion; and a third conductive via, disposed between the first circuit portion and the second circuit portion, wherein the island portion is in contact with a top surface of the MRAM cell, wherein a projection area of the island portion on the substrate is larger than a projection area of the MRAM cell on the substrate.

8. The semiconductor structure of claim 7, wherein the island portion is connected to the top surface of the MRAM cell.

9. The semiconductor structure of claim 7, wherein the island portion and the first circuit portion are located at the same level.

10. The semiconductor structure of claim 9, wherein a top surface of the island portion is coplanar with a top surface of the first circuit portion.

11. The semiconductor structure of claim 7, wherein the bit line portion and the second circuit portion are located at the same level.

12. The semiconductor structure of claim 11, wherein a top surface of the bit line portion is coplanar with a top surface of the second circuit portion.

13. The semiconductor structure of claim 7, wherein a height of the second conductive via is the same as a height of the third conductive via.

14. The semiconductor structure of claim 7, wherein a semiconductor device is disposed on a surface of the substrate, and the circuit layer is electrically connected to the semiconductor device.

15. The semiconductor structure of claim 14, wherein the semiconductor device comprising a transistor.

16. The semiconductor structure of claim 7, wherein the MRAM cell comprises a top electrode, a bottom electrode and a MTJ structure disposed between the top electrode and the bottom electrode.

* * * * *